United States Patent
Wang et al.

(10) Patent No.: US 8,269,321 B2
(45) Date of Patent: Sep. 18, 2012

(54) LOW COST LEAD FRAME PACKAGE AND METHOD FOR FORMING SAME

(75) Inventors: Ken Jian Ming Wang, San Francisco, CA (US); Matthew Vernon Kaufmann, Morgan Hill, CA (US)

(73) Assignee: Broadcom Corporation, Irvine, CA (US)

( * ) Notice: Subject to any disclaimer, the term of this patent is extended or adjusted under 35 U.S.C. 154(b) by 595 days.

(21) Appl. No.: 11/897,036

(22) Filed: Aug. 28, 2007

(65) Prior Publication Data

US 2009/0057858 A1  Mar. 5, 2009

(51) Int. Cl.
*H01L 23/495* (2006.01)
(52) U.S. Cl. . 257/666; 257/670; 257/673; 257/E23.031; 257/E23.039
(58) Field of Classification Search .......... 257/666, 257/670, 671, 673, 676, 677, E23.031, E23.039, 257/E23.04, E23.06, E21.506
See application file for complete search history.

(56) References Cited

U.S. PATENT DOCUMENTS 6,060,771 A * 5/2000 Tomikawa et al. ............ 257/676
7,205,645 B2 * 4/2007 Nakamura et al. ............ 257/686
* cited by examiner

*Primary Examiner* — Zandra Smith
*Assistant Examiner* — Paul Patton
(74) *Attorney, Agent, or Firm* — Farjami & Farjami LLP

(57) ABSTRACT

According to one exemplary embodiment, a lead frame package includes a number of leads and a number of contacts, where each of the contacts is situated over one of the leads. The lead frame package further includes a semiconductor die including a number of bond pads. Each of the contacts is directly attached and bonded to one of the bond pads on the semiconductor die. Each of the contacts is situated over a top portion of one of the leads, where the top portion has a shorter length than a middle portion of each of the leads. Each of the contacts is connected to one of the bond pads on the semiconductor die without a wire bond. The semiconductor die does not include a redistribution layer situated over an active surface of the semiconductor die.

19 Claims, 7 Drawing Sheets

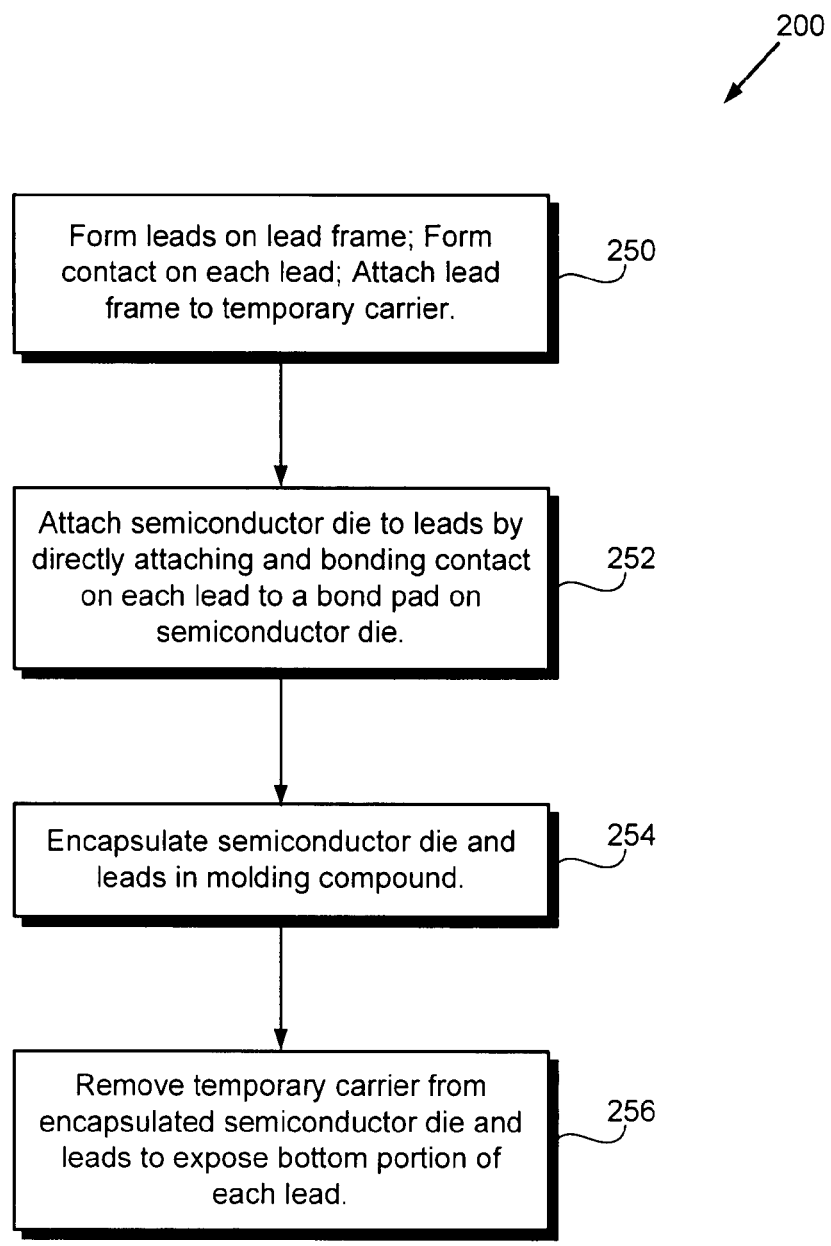

LOW COST LEAD FRAME PACKAGE AND METHOD FOR FORMING SAME

BACKGROUND OF THE INVENTION

1. Field of the Invention

The present invention is generally in the field of semiconductors. More particularly, the invention is in the field of semiconductor packaging.

2. Background Art

A lead frame package is a commonly utilized semiconductor package in which a semiconductor die is attached to a lead frame and encapsulated in molding compound for protection from environmental contaminants and damage from handling. In the lead frame package, the lead frame can include a paddle for providing structural support for the semiconductor die and a number of leads for providing electrical connectivity between the die and external structures, such as system-level circuit boards. Conventionally, wire bond technology and flip chip technology have been utilized to electrically connect the semiconductor die to the leads of the lead frame.

In a conventional lead frame package utilizing wire bond technology, bond pads on the semiconductor die are electrically connected to the respective leads of the lead frame through wire bonds. However, the wire bonds have inductance and resistance, which can undesirably reduce the performance of the conventional lead frame package. Also, the wire bonds are typically made of gold, which undesirably increases the cost of the conventional lead frame package.

In a conventional lead frame package utilizing flip chip technology, solder bumps are formed over the active surface of the die and connected to bond pads on the semiconductor die by a routing layer, such as a redistribution layer (RDL). The semiconductor die is then "flipped" over so that the solder bumps contact the respective leads of the lead frame, thereby providing to electrical connectivity between the die and the leads. However, the solder bumps and the routing layer that are required to form a flip chip can undesirably increase the cost of the conventional lead frame package.

SUMMARY OF THE INVENTION

Low cost lead frame package and method for forming same as shown in and/or described in connection with at least one of the figures, as set forth more completely in the claims.

BRIEF DESCRIPTION OF THE DRAWINGS

FIG. 2 is a flowchart illustrating an exemplary method for forming a lead frame package in accordance with one embodiment of the present invention.

DETAILED DESCRIPTION OF THE INVENTION

The present invention is directed to a low cost lead frame package and method for forming same. The invention also teaches a method of flipping bumpless chips, i.e. chips without a redistribution layer (RDL), on a modified lead frame. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
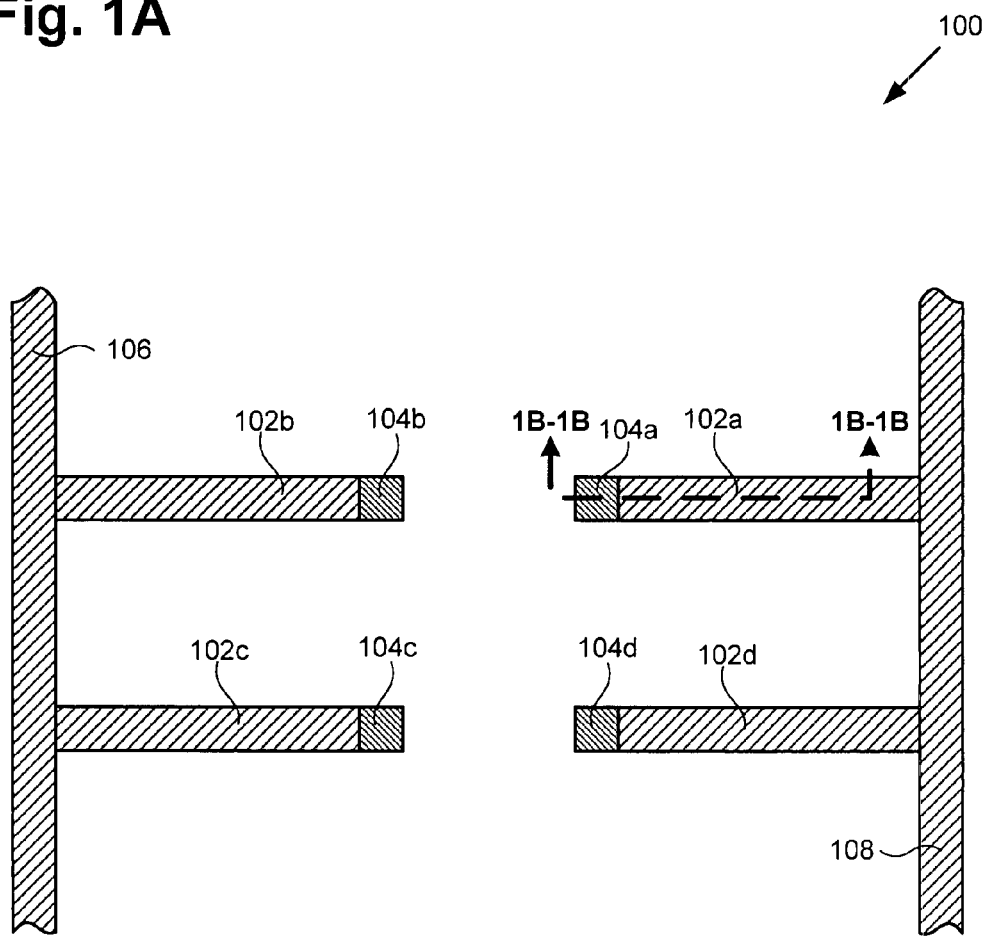
FIG. 1A illustrates a top view of an exemplary lead frame including exemplary leads and contacts in accordance with one embodiment of the present invention.

FIG. 1A shows a top view of lead frame 100 in accordance with one embodiment of the present invention. Lead frame 100 includes leads 102a, 102b, 102c, and 102d (hereinafter "leads 102a through 102d"), contacts 104a, 104b, 104c, and 104d (hereinafter "contacts 104a through 104d"), and guard rails 106 and 108. Lead frame 100 can be fabricated on, for example, a strip that includes a number of other lead frames (riot shown in FIG. 1A). It is noted that although a lead frame with four leads, i.e., lead frame 100, is utilized to illustrate an embodiment of the present invention, the present invention may include a lead frame having less than or more than four leads.

As shown in FIG. 1A, leads 102a and 102d are attached to guard rail 108 and leads 102b and 102c are attached to guard rail 106. Leads 102a through 102d and guard rails 106 and 108 can comprise, for example, copper, aluminum, or other suitable metal. Each of leads 102a through 102d include a land (not shown in FIG. 1A), which is formed on the bottom surface of the lead. Also shown in FIG. 1A, contacts 104a through 104d are situated over the top surface of respective leads 102a through 102d and situated at an end of each lead. Each of contacts 104a through 104d can be situated over a top portion of the lead (not shown in FIG. 1A).

Contacts 104a through 104d can comprise gold or other suitable metal. An adhesion layer comprising nickel or other suitable metal (not shown in FIG. 1A) can be situated between contacts 104a through 104d and respective leads 102a through 102d to enable the contacts to adequately adhere to the leads. Contacts 104a through 104d can be formed, for example, by depositing a layer of gold over the adhesion layer (not shown in FIG. 1A) on the respective leads by utilizing an electroplating process or other suitable deposition process, by dipping the ends of the respective leads in a suitable chemical solution comprising gold, or by other suitable processes as are known in the art.

Lead 102a, which is substantially similar to leads 102b, 102c, and 102d in composition, dimensions, and method of formation, and contact 104a, which is substantially similar to contacts 104b, 104c, and 104d in composition, dimensions, and method of formation, are further discussed below in relation to FIG. 1B.

Figure 1B:
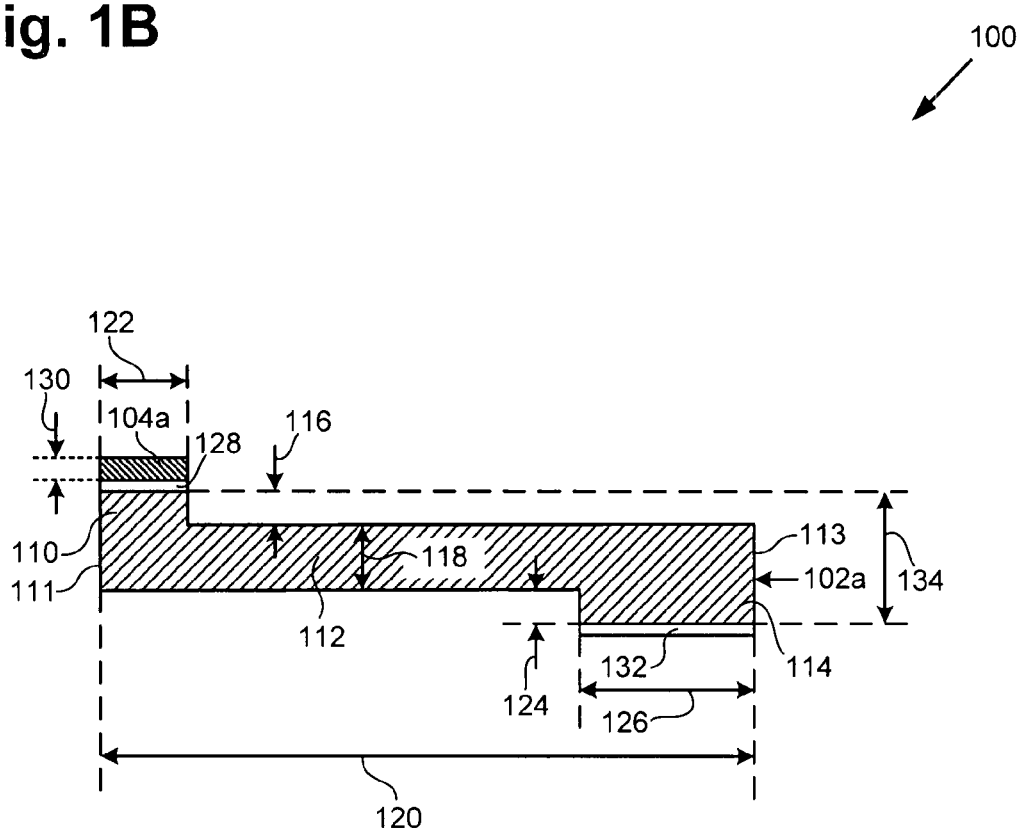
FIG. 1B illustrates a cross-sectional view of an exemplary lead and an exemplary contact of FIG. 1A.

FIG. 1B shows a cross-sectional view of lead 102a and contact 104a in FIG. 1A along line 1B-1B in FIG. 1A. In particular, lead 102a and contact 104a correspond to the same elements in FIG. 1A and FIG. 1B. As shown in FIG. 1B, lead 102a includes top portion 110, middle portion 112, and bottom portion 114. Top portion 110 of lead 102a, which is situated at end 111 of lead 102a, has thickness 116, which corresponds to the distance that top portion 110 extends above middle portion 112 of the lead. Thickness 116 can be, for example, approximately 12.5 microns. However, thickness 116 may also be less than or greater than 12.5 microns. Middle portion 112 of lead 102a has thickness 118, which can be, for example, approximately 25.0 microns. However, thickness 118 may also be less than or greater than 25.0 microns. Middle portion 112 has length 120, which is substantially greater than length 122 of top portion 110.

Bottom portion 114 of lead 102a, which is situated at end 113 of lead 102a, has length 126 and thickness 124, which corresponds to the distance that bottom portion 114 extends below middle portion 112. Thickness 124 can be, for example, approximately 12.5 microns. However, thickness 124 may also be less than or greater than 12.5 microns. In the present embodiment, length 126 can be substantially less than length 120 of middle portion 112. In one embodiment, length 126 of bottom portion 114 may be substantially equal to length 120 of middle portion 112. In that embodiment, bottom portion 114 can extend between ends 111 and 113 of lead 102a. Lead 102a can be formed by utilizing a suitable etch process to form top portion 110 and bottom portion 114 from a lead having initial thickness 134 between ends 111 and 113. In one embodiment, lead 102a can be formed by utilizing a suitable etch process to form top portion 110 from a lead having initial thickness 134 between ends 111 and 113 and not etching the bottom portion of lead 102a. In that embodiment, length 126 of bottom portion 114 of lead 102a is substantially equal to length 120 of middle portion 112.

Also shown in FIG. 1B, adhesion layer 128 is situated over top portion 110 of lead 102a and contact 104a is situated over adhesion layer 128. Adhesion layer 128, which is utilized to cause contact 104a to adhere to lead 102a, can comprise nickel or other suitable metal. Adhesion layer 128 can be formed by utilizing a plating process or other suitable deposition process to deposit nickel or other suitable metal on the top surface of top portion 110 of lead 102a. In one embodiment, adhesion layer 128 may not be utilized. Contact 104a can comprise, for example, gold, and has thickness 130, which can be between 5.0 and 10.0 microns. However, thickness 130 may also be less than 5.0 microns or greater than 10.0 microns. Contact 104a can be formed, for example, by depositing a layer of gold over adhesion layer 128, by utilizing an electroplating process or other suitable deposition process, by dipping the end 111 of lead 102a in a suitable chemical solution comprising gold, or by other suitable processes as are known in the art. Further shown in FIG. 1B, adhesion layer 132, which is an optional layer, is situated on the surface of bottom portion 114 of lead 102a. Adhesion layer 132 can comprise a similar material and can be formed in a similar manner as adhesion layer 128. In another embodiment, adhesion layer 132 may not be used.

In the present invention, contacts, such as contacts 104a through 104d, can be bonded to respective bond pads of a semiconductor die during formation of the invention's lead frame package, which is discussed below in relation to FIGS. 2, 3A, 3B, 3C, and 3D.

FIG. 2 shows a flow chart illustrating a method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 250 through 256 indicated in flowchart 200 are sufficient to describe one embodiments of the present invention; however, other embodiments of the invention may utilize steps different from those shown in flowchart 200. Moreover, structures 350 through 356 in FIGS. 3A through 3D illustrate the result of performing steps 250 through 256 of flowchart 200, respectively. For example, structure 350 shows a structure after processing step 250, structure 352 shows structure 350 after the processing of step 252, structure 354 shows structure 352 after the processing of step 254, and so forth.

Figure 3A:
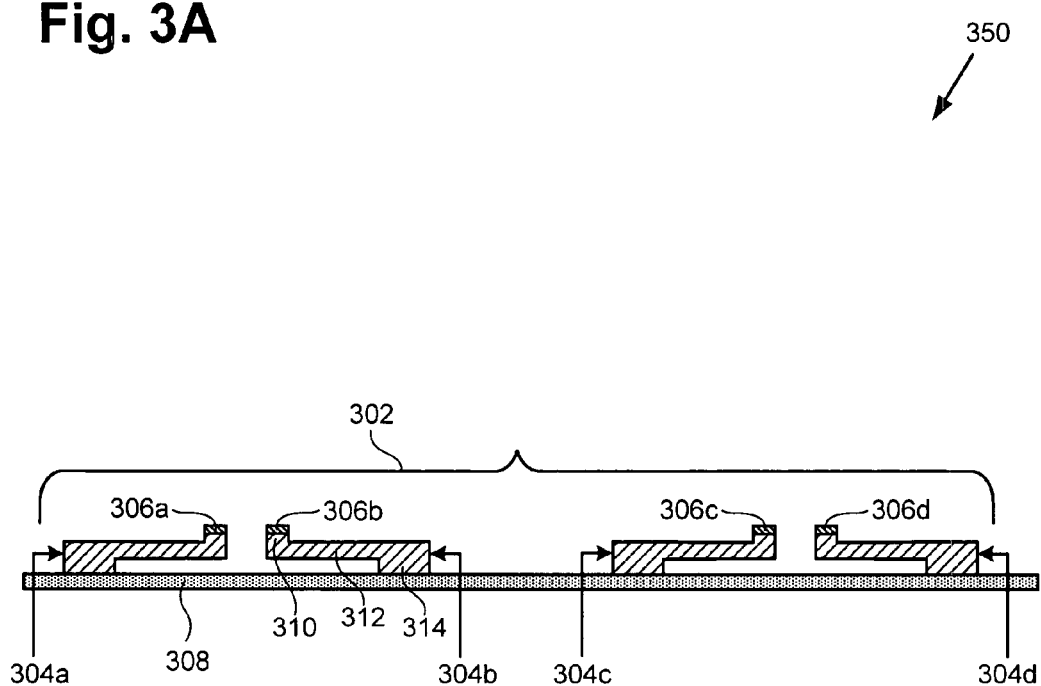
FIG. 3A illustrates a cross-sectional view of a structure corresponding to an initial step in the flowchart in FIG. 2, in accordance with one embodiment of the present invention.

Referring now to step 250 in FIG. 2 and structure 350 in FIG. 3A, at step 250 of flowchart 200, leads 304a, 304b, 304c, and 304d (hereinafter "leads 304a through 304d") are formed on lead frame 302, contacts 306a, 306b, 306c, and 306d (hereinafter "contacts 306a through 306d") are formed on respective leads 304a through 304d, and lead frame 302 is attached to temporary carrier 308. As shown in FIG. 3A, leads 304a through 304d as situated on temporary carrier 308, which provides support for leads 304a through 304d. Temporary carrier 308 can comprise, for example, plastic tape or other suitable material as is known in the art. Lead frame 302 can include guard rails (not shown in FIG. 3A), such as guard rails 106 and 108 in FIG. 1A, to also provide support for leads 304a through 304d.

Each of leads 304a through 304d can be substantially similar in composition, dimensions, and method of formation as lead 102a in FIG. 1B. Each of leads 304a through 304d has top portion 310, middle portion 312, and bottom portion 314, which correspond, respectively, to top portion 110, middle portion 112, and bottom portion 114 of lead 102a in FIG. 1B. Bottom portion 314 of each of leads 304a through 304d form a bottom pad, such as a land pad, at the bottom surface of the lead. Each of leads 304a through 304d can comprise copper, aluminum, or other suitable metal. In one embodiment, an adhesion layer, such as adhesion layer 132 in FIG. 1B, is formed over the bottom surface of bottom portion 314. The adhesion layer can comprise, for example, a layer of nickel or other suitable metal.

As also shown in FIG. 3A, contacts 306a through 306d are situated over top portion 310 of respective leads 304a through 304d. Each of contacts 306a through 306d is substantially similar in composition, dimensions, and method of fabrication as contact 104a in FIG. 1B. Each of contacts 306a through 306d can comprise, for example, gold. An adhesion layer (not shown in FIG. 3A), such as adhesion layer 128 in FIG. 1B, can be situated between each of contacts 306a through 306d and top portion 310 of each of leads 304a through 304d. The adhesion layer (not shown in FIG. 3A) can be formed by, for example, utilizing a suitable deposition process, such as a plating process, to deposit a layer of nickel on top portion 310 of each of leads 304a through 304d. After the adhesion layer has been formed, contacts 306a through 306d can be formed on respective leads 304a through 304d by, for example, depositing a layer of gold on the adhesion layer. The layer of gold can be deposited on the adhesion layer by utilizing a plating process or other suitable deposition process as is known in the art. The result of step 250 of flowchart 200 is illustrated by structure 350 in FIG. 3A.

Figure 3B:
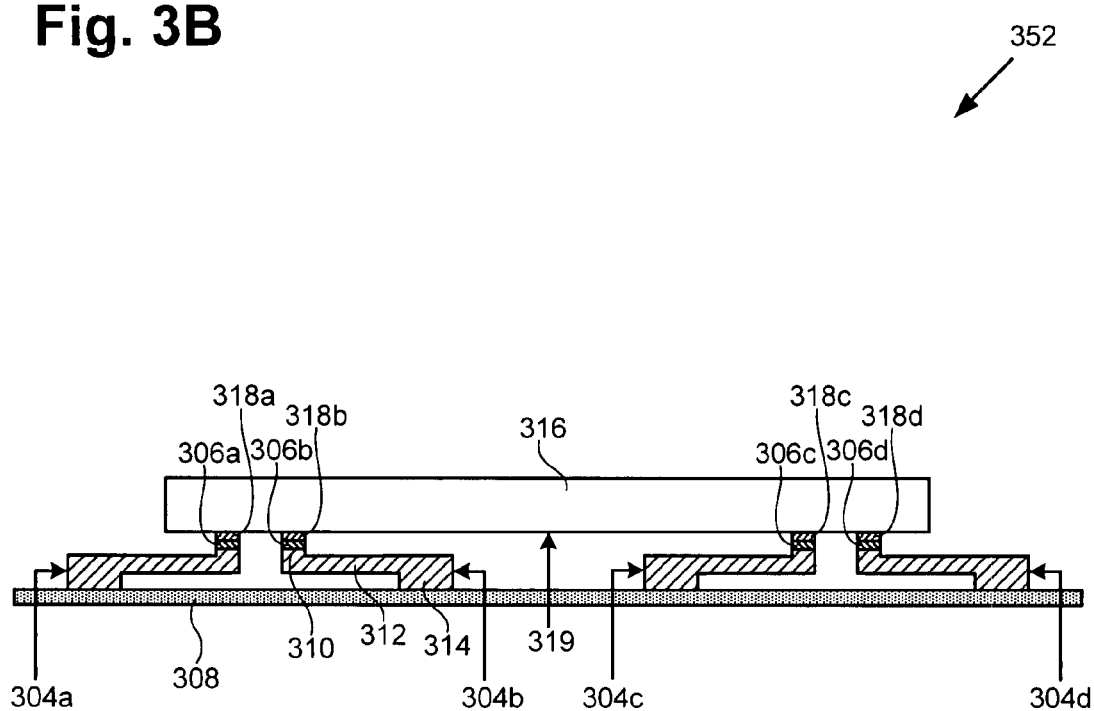
FIG. 3B illustrates a cross-sectional view of a structure corresponding to an intermediate step in the flowchart in FIG. 2, in accordance with one embodiment of the present invention.

Referring to step 252 in FIG. 2 and structure 352 in FIG. 3B, at step 252 of flowchart 200, semiconductor die 316 is attached to leads 304a through 304d by directly attaching and bonding contacts 306a through 306d to respective bond pads 318a, 318b, 318c, and 318d (hereinafter "bond pads 318a through 318d") on semiconductor die 316. As shown in FIG. 3B, semiconductor die 316 includes bond pads 318a through 318d, which are situated on active surface 319 of semiconductor die 316. Also shown in FIG. 3B, bond pads 318a through 318d of semiconductor die 316 are situated on respective contacts 306a through 306d. Each of contacts 306a through 306d is directly attached and bonded to one of bond pads 318a through 318d. Semiconductor die 316 can be attached to leads 304a through 304d by "flipping" semiconductor die 316 such that active surface 319 of the die is facing leads 304a through 304d and placing the die on the leads such that bond pads 318a through 318d are aligned with respective contacts 306a through 306d. A reflow process or other suitable process can then be used to heat contacts 306a through 306d to a sufficient temperature so as to cause bond pads 318a through 318d to bond to respective contacts 306a through 306d.

By directly attaching and bonding contacts 306a through 306d to respective bond pads 318a through 318d, semiconductor die 316 is physically attached and electrically connected to leads 304a through 304d. The result of step 252 of flowchart 200 is illustrated by structure 352 in FIG. 3B.

Figure 3C:
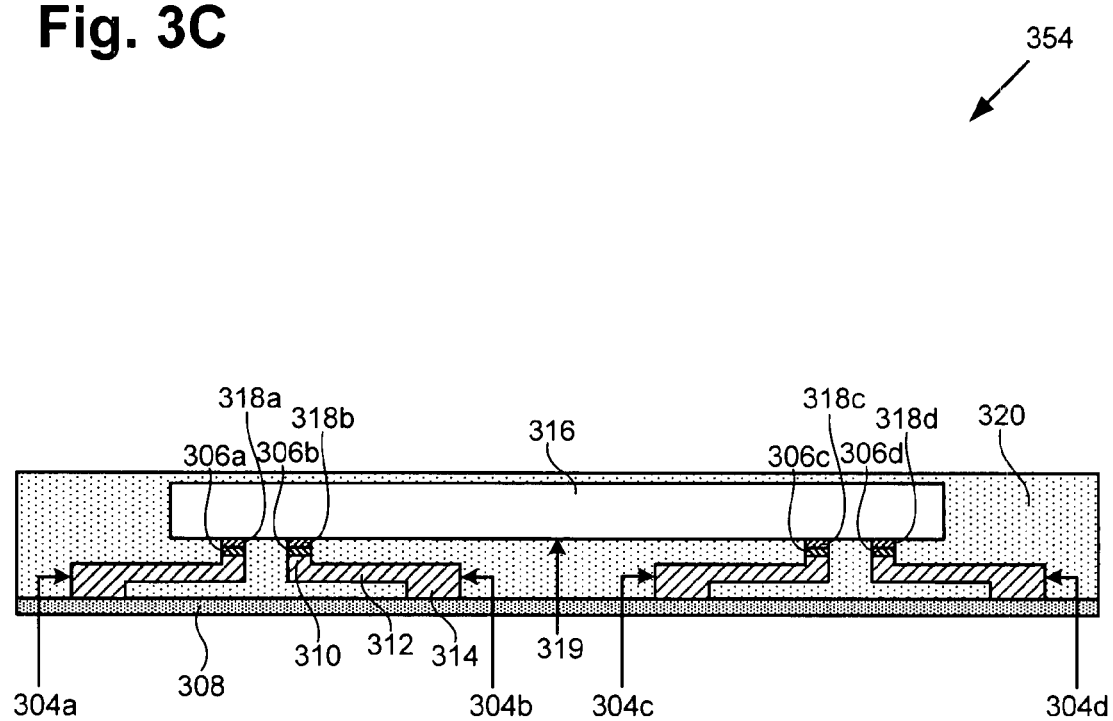
FIG. 3C illustrates a cross-sectional view of a structure corresponding to an intermediate step in the flowchart in FIG. 2, in accordance with one embodiment of the present invention.

Referring to step 254 in FIG. 2 and structure 354 in FIG. 3C, at step 254 of flowchart 200, semiconductor die 316 and leads 304a through 304d are encapsulated in molding compound 320. As shown in FIG. 3C, molding compound 320 surrounds semiconductor die 316, contacts 306a through 306d, and leads 304a through 304d and is situated on the top surface of temporary carrier 308. Molding compound 320 can comprise epoxy or other suitable material as is known in the art protects semiconductor die 316 from environmental contaminants and damage from handling the die. Molding compound 320 can be formed by utilizing a suitable molding process as is known in the art. The result of step 254 of flowchart 200 is illustrated by structure 354 in FIG. 3C.

Figure 3D:
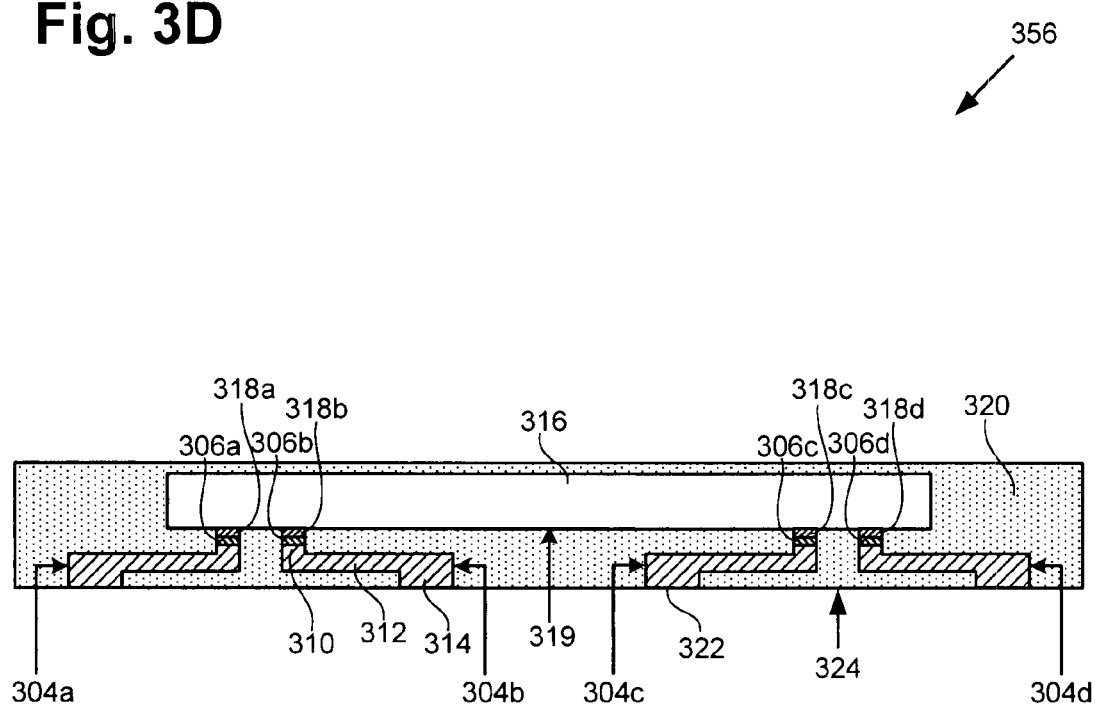
FIG. 3D illustrates a cross-sectional view of a structure corresponding to a final step in the flowchart in FIG. 2, in accordance with one embodiment of the present invention.

Referring to step 256 in FIG. 2 and structure 356 in FIG. 3D, at step 256 of flowchart 200, temporary carrier 308 is removed to expose bottom surface 322 of bottom portion 314 of each of leads 304a through 304d. As shown in FIG. 3D, by removing temporary carrier 308 (shown in FIGS. 3A, 3B, and 3C), bottom surface 322 of bottom portion 314 of each of leads 304a through 304d is exposed on bottom surface 324 of structure 356, which forms a lead frame package, such as an LGA (land grid array) lead frame package. Bottom portion 314 of each of leads 304a through 304d forms a bottom pad, such as a land pad, which provides electrical connectivity between a correspond bond pad on semiconductor die 316 and a pad on an external circuit board (not shown in FIG. 3D), such a system circuit board. The invention's lead frame package can be mounted to a system circuit board (not shown in FIG. 3D) by utilizing, for example, surface mount technology (SMT). Temporary carrier 308 (shown in FIGS. 3A, 3B, and 3C) can be removed by utilizing an etch process or other suitable process as is known in the art. The result of step 256 of flowchart 200 is illustrated by structure 356 in FIG. 3D.

In the embodiment of the invention's method for fabricating a lead frame package discussed above in relation to FIGS. 2, 3A, 3B, 3C, and 3D, the invention's lead frame package is fabricated after the semiconductor die has been singulated. However, the invention's method for fabricating a lead frame package also applies to wafer level packaging. In a wafer level packaging as applied to the present invention, a number of lead frames can be formed corresponding to the number of semiconductor dies on a wafer. Each lead frame can include a number of leads that correspond to the number of bond pads on each semiconductor die. A contact, such as contacts 306a through 306d in FIGS. 3A through 3D, can be formed on each lead of each lead frame. The lead frames can then be placed on temporary carriers, such as temporary carrier 308 in FIGS. 3A through 3D.

All of the semiconductor dies on the wafer can then be attached to the respective leads on the lead frames by bonding the contacts to the appropriate bond pads on each semiconductor die. The semiconductor dies and the associated lead frames can then be encapsulated in a molding compound. The temporary carriers can be removed and a singulation process can be performed to form a number of the invention's lead frame packages.

By forming a contact on each lead of a lead frame, by attaching a semiconductor die directing to the leads of the lead frame by directly attaching and bonding each contact to a bond pad on the semiconductor die, and by encapsulating the semiconductor die and the leads in a molding compound, an embodiment of the present invention in FIGS. 2, 3A, 3B, 3C, and 3D provides a low cost lead frame package, such as a low cost LGA lead frame package. The invention's lead frame package effectively mimics a conventional lead frame package that utilizes flip chip technology to attach a semiconductor die to a lead frame. However, the invention's lead frame package utilizes a semiconductor die that does not require modifications, such as does solder bumps and a routing layer, such as an RDL, as typically required in a conventional lead frame package that utilizes flip chip technology. As a result the invention's lead frame package can be advantageously fabricated at a lower cost than a conventional flip chip lead frame package.

Also, the invention's lead frame package does not require wire bonds to electrically connect bond pads on the die to the leads of a lead frame. By avoiding the resistance and inductance associated wire bonds, invention's lead frame package advantageously achieves increased performance compared to a conventional lead frame package that utilizes wire bond technology. Also, the invention's lead frame package advantageously avoids the cost of gold wire bonds, which are typically utilized in a conventional wire-bonded lead frame package. Furthermore, by avoiding bond wires, the invention's lead frame package advantageously achieves a lower profile compared to the conventional wire-bonded lead frame package.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a low cost lead frame package and method for forming same have been described.

The invention claimed is:
1. A lead frame package comprising:
a plurality of leads, each of said plurality of leads having a top portion situated at an end of a middle portion and extending above said middle portion, and a bottom portion situated at an opposite end of said middle portion and extending below said middle portion;
a plurality of contacts, each of said contacts being situated over one of said plurality of leads;
a semiconductor die comprising a plurality of bond pads; and a molding compound encapsulating said plurality of leads so as to substantially surround said plurality of leads;

wherein each of said plurality of contacts is directly attached to one of said plurality of bond pads on said semiconductor die, and wherein said molding compound substantially surround said plurality of leads.

2. The lead frame package of claim 1 wherein said molding compound is encapsulating said semiconductor die.

3. The lead frame package of claim 1, wherein each of said plurality of contacts is situated over said top portion of one of said plurality of leads.

4. The lead frame package of claim 3, wherein said top portion has a shorter length than said middle portion of each of said plurality of leads.

5. The lead frame package of claim 1, wherein each of said contacts is connected to one of said plurality of bond pads without a wire bond.

6. The lead frame package of claim 1, wherein each of said plurality of contacts comprises gold.

7. The lead frame package of claim 1, wherein said semiconductor die does not comprise a redistribution layer over an active surface of said semiconductor die.

8. The lead frame package of claim 1 further comprising an adhesion layer situated between each of said plurality of contacts and each of said plurality of leads.

9. The lead frame package of claim 1, wherein said bottom portion of each of said plurality of leads forms a land pad.

10. The lead frame package of claim 9, wherein a length of said bottom portion of each of said plurality of leads is less than a length of said middle portion of each of said plurality of leads.

11. A semiconductor package including a molding compound encapsulating a semiconductor die, said semiconductor package comprising:

a lead frame comprising a plurality of leads and a plurality of contacts, wherein each of said plurality of leads includes a top portion situated at an end of a middle portion and extending above said middle portion, and a bottom portion situated at an opposite end of said middle portion and extending below said middle portion, wherein each of said plurality of contacts is situated over one of said plurality of leads, and wherein said molding compound is encapsulating said plurality of leads so as to substantially surround said plurality of leads;

said semiconductor die comprising a plurality of bond pads, said semiconductor die not including a redistribution layer over an active surface of said semiconductor die;

wherein each of said plurality of contacts is directly attached to one of said plurality of bond pads without a wire bond.

12. The semiconductor package of claim 11, wherein said lead frame is attached to a carrier.

13. The semiconductor package of claim 11, wherein a bottom portion of each of said plurality of leads is exposed through said molding compound.

14. The semiconductor package of claim 11, wherein each of said plurality of contacts is situated over said top portion of one of said plurality of leads.

15. The semiconductor package of claim 14, wherein said top portion has a substantially shorter length than said middle portion of each of said plurality of leads.

16. The semiconductor package of claim 11, wherein each of said plurality of contacts comprises gold.

17. The semiconductor package of claim 11 further comprising an adhesion layer situated between each of said plurality of contacts and each of said plurality of leads.

18. The semiconductor package of claim 11, wherein said bottom portion of each of said plurality of leads forms a land pad.

19. The semiconductor package of claim 18, wherein a length of said bottom portion of each of said plurality of leads is substantially less than a length of said middle portion of each of said plurality of leads.

* * * * *